(12) United States Patent
LaClair

(10) Patent No.: US 7,129,701 B2
(45) Date of Patent: Oct. 31, 2006

(54) METHOD OF INDUCTIVE PROXIMITY SENSING

(75) Inventor: Robert D. LaClair, Richmond, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 132 days.

(21) Appl. No.: 10/991,709

(22) Filed: Nov. 18, 2004

(65) Prior Publication Data
US 2006/0103372 A1    May 18, 2006

(51) Int. Cl.
   *G01B 7/14* (2006.01)
(52) U.S. Cl. .............................. 324/207.26; 324/207.16
(58) Field of Classification Search ................................
   324/207.15–207.17, 207.26
   See application file for complete search history.

(56) References Cited

U.S. PATENT DOCUMENTS

| | | | | |
|---|---|---|---|---|
| 3,609,580 | A | * | 9/1971 | Thompson et al. ............ 331/65 |
| 4,618,823 | A | * | 10/1986 | Dahlheimer et al. ... 324/207.16 |
| 4,678,994 | A | * | 7/1987 | Davies ........................ 324/236 |
| 5,065,093 | A | * | 11/1991 | Nauta et al. ............ 324/207.12 |
| 5,420,507 | A | * | 5/1995 | Laskowski ................... 324/236 |
| 6,424,145 | B1 | * | 7/2002 | Woolsey et al. ............ 324/202 |
| 6,734,665 | B1 | * | 5/2004 | Jagiella et al. ......... 324/207.16 |

FOREIGN PATENT DOCUMENTS

DE         19516934        *  8/1996

* cited by examiner

*Primary Examiner*—Jay M. Patidar
(74) *Attorney, Agent, or Firm*—Calfee, Halter & Griswold; Peter M. Hernandez, Esq.

(57) ABSTRACT

A method of non-intrusive, inductive proximity sensing of a target through a conductive barrier comprises the steps of: disposing an inductive proximity sensor on one side of a barrier of conductive material; disposing a target on the other side of the barrier; determining an appropriate drive frequency for operating the proximity sensor based on the conductive material and thickness of the barrier; and operating the proximity sensor with the appropriate drive frequency to non-intrusively sense the proximity of the target through the conductive barrier. The method may include the steps of: varying the gap between the target and proximity sensor over a gap range; measuring the inductive output of the proximity sensor at the appropriate drive frequency and different gaps to obtain inductive output measurements at the different gaps; determining the operating induction bandwidth of the proximity sensor operated at approximately the appropriate drive frequency from the inductive output measurements at the different gaps; and using the determined induction bandwidth for proximity sensing of the target through the conductive barrier. The gap range may be based on a sensor/target gap variation during actuation for a particular application.

20 Claims, 7 Drawing Sheets

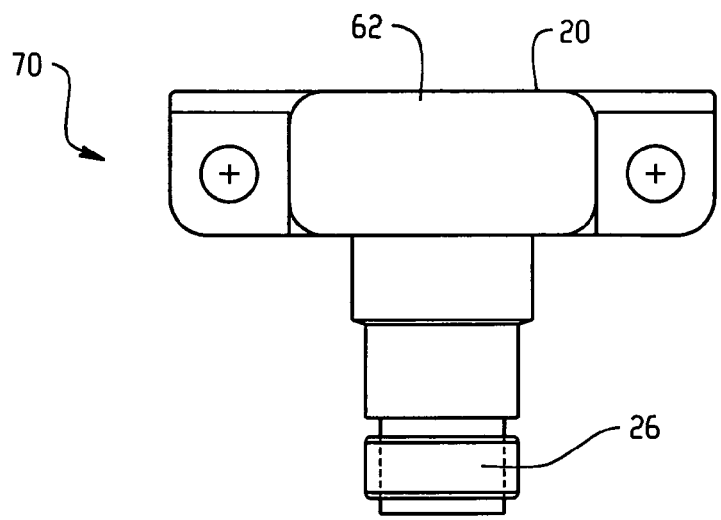
Fig. 4
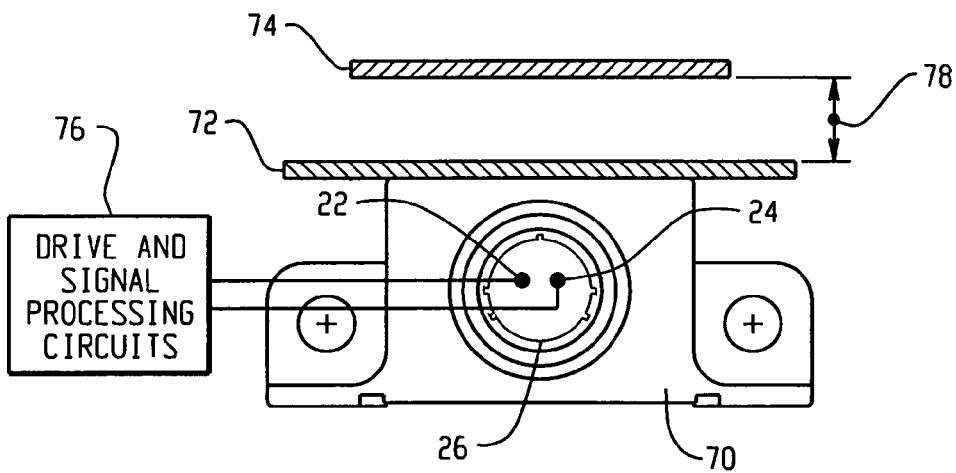
Fig. 5
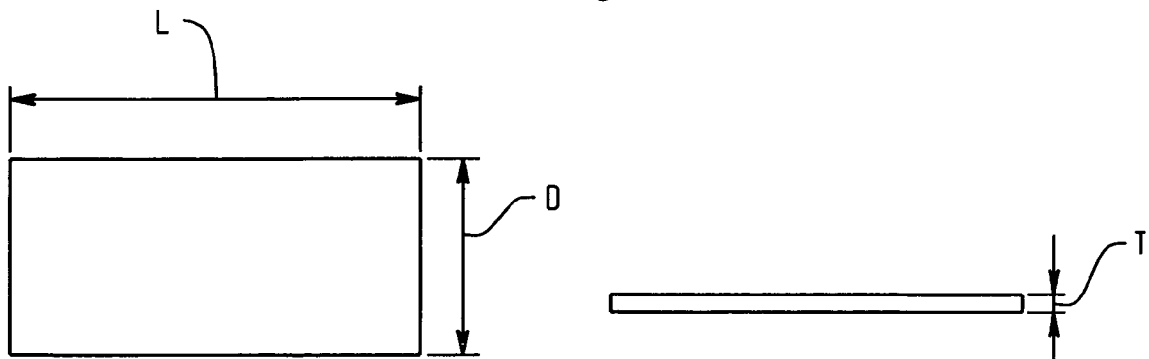
Fig. 6A
Fig. 6B

METHOD OF INDUCTIVE PROXIMITY SENSING

BACKGROUND OF THE INVENTION

The present invention is directed to inductive proximity sensors in general, and more particularly, to a method of non intrusive inductive proximity sensing of a permeable or magnetic target through a barrier of conductive material.

Inductive proximity sensors typically comprise a core, which may be "C" or Omega shaped, for example, fabricated from a highly-permeable metal, with two inductive coils on bobbins placed over each leg of the core. The two coils are typically wound around their respective bobbins in opposite directions (one wound clockwise and the other wound counter-clockwise) and electrically connected in series. The series connected coils of the sensor are generally driven by an AC voltage at a desired frequency. The generated coil current, which may be monitored by a current sensing device, is commonly used as an inductive output of the sensor. Generally, the inductive output changes value when a target to be sensed moves from a near to a far position with respect to a sensing face of the sensor, and vice versa. There should be a sufficient change in value of inductive output over the span of operating conditions in order to be able to distinguish between the near and far target positions.

Inductive proximity sensors are typically driven at frequencies between 1 KHz and 5 KHz. When attempting to sense the position of a target of magnetic material through a conductive barrier (i.e. non-intrusive proximity sensing) at these frequencies, significant eddy currents are generated in the conductive material of the barrier. These eddy currents directly oppose the inductive currents generated in the sensor and attenuate the inductive output signal of the sensor. This renders the proximity sensor virtually useless for detecting permeable or magnetic targets through a conductive barrier.

The present invention as will be described in greater detail herein below includes a method of non-intrusive proximity sensing of a permeable or magnetic target through a conductive barrier.

SUMMARY OF THE INVENTION

In accordance with one aspect of the present invention, a method of non-intrusive, inductive proximity sensing of a target through a conductive barrier comprises the steps of: disposing an inductive proximity sensor on one side of a barrier of conductive material; disposing a target on the other side of the barrier; applying an operating drive frequency to the inductive proximity sensor; varying the drive frequency over a frequency range; measuring an inductive output of the proximity sensor at different drive frequencies and different target positions in relation to the proximity sensor to obtain inductive output measurements; determining an appropriate drive frequency for operating the proximity sensor from the inductive output measurements; and operating the proximity sensor with the appropriate drive frequency to non-intrusively sense the proximity of the target through the conductive barrier.

In accordance with another aspect of the present invention, a method of non-intrusive, inductive proximity sensing of a target through a conductive barrier comprises the steps of: disposing an inductive proximity sensor on one side of a barrier of conductive material; disposing a target on the other side of the barrier; determining an appropriate drive frequency for operating the proximity sensor based on the conductive material and thickness of the barrier; and operating the proximity sensor with the appropriate drive frequency to non-intrusively sense the proximity of the target through the conductive barrier.

In accordance with yet another aspect of the present invention, a method of determining an operating induction bandwidth of a non-intrusive, inductive proximity sensor for sensing of a target through a conductive barrier comprises the steps of: disposing an inductive proximity sensor on one side of a barrier of conductive material; disposing a target on the other side of the barrier; determining an appropriate drive frequency for operating the proximity sensor; varying the gap between the target and proximity sensor over a gap range; measuring an inductive output of the proximity sensor at the appropriate drive frequency and different gaps to obtain inductive output measurements at the different gaps; and determining the operating induction bandwidth of the proximity sensor operated at approximately the appropriate drive frequency from the inductive output measurements at the different gaps.

BRIEF DESCRIPTION OF THE DRAWINGS

FIG. 4 is an illustration of a proximity sensor suitable for use in another aspect of the present invention.

FIG. 5 is an illustration of a non-intrusive proximity sensing configuration suitable for use in the other aspect of the present invention.

FIGS. 6a and 6B are illustrations depicting plan and side views, respectively, of a target for use in the other aspect of the present invention.

DETAILED DESCRIPTION OF THE INVENTION

Figure 1A:
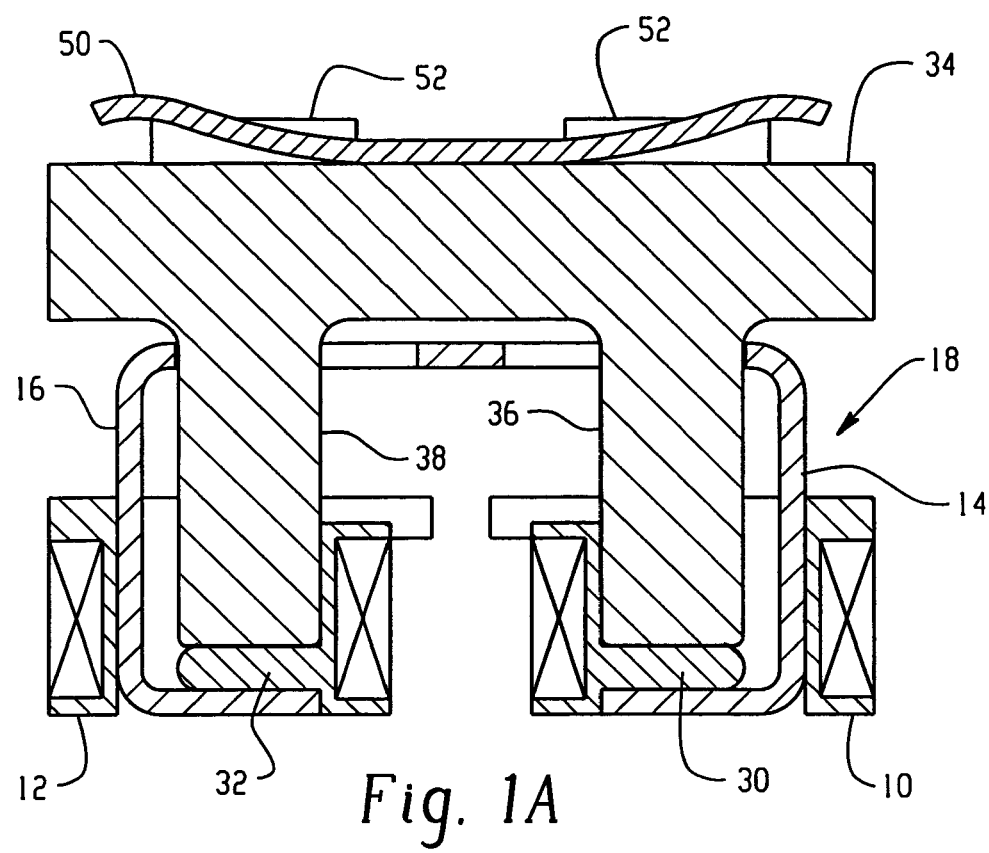
FIGS. 1A and 1B are cross-sectional profile and side views, respectively, of internal components of an exemplary proximity sensor assembly suitable for embodying the broad principles of the present invention.
Figure 1B:
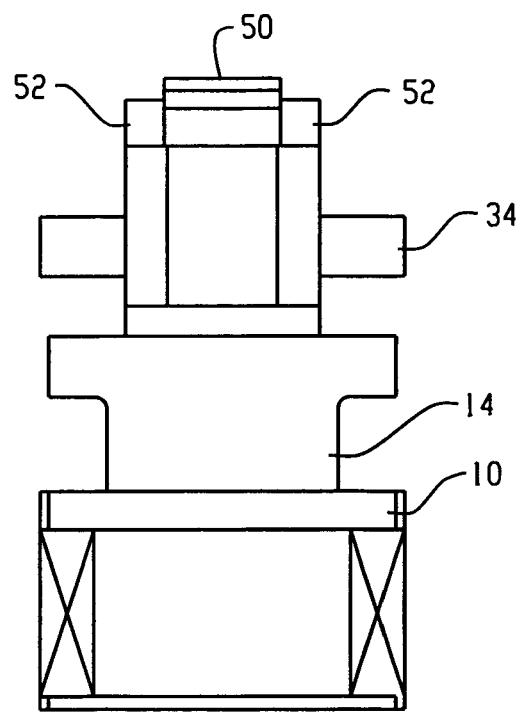
Figure 1C:
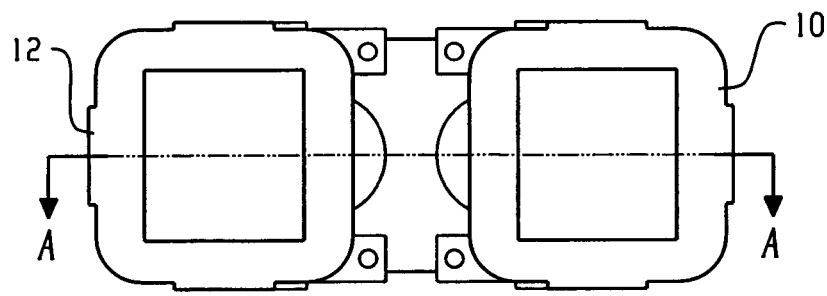
FIG. 1C is a bottom view of the assembled internal components of the exemplary sensor assembly embodiment of FIG. 1.

An exemplary embodiment of a proximity sensor assembly suitable for embodying the broad principles of the present invention will be described in connection with FIGS. 1A, 1B, 1C, 2 and 3. Referring to FIGS. 1A, 1B, 1C, 2 and 3, a pair of coil wound, square cross-sectional bobbins 10 and 12 are disposed over respective legs 14 and 16 of an inductive core 18, which may be C-shaped, for example. Each bobbin is wound with a precise number of turns in order to meet the specified inductance of the proximity sensor. One bobbin, like 10, for example, may be wound with the inductive coil clockwise and the other bobbin, like 12, for example, may be wound with the inductive coil counter-clockwise. The windings of the two bobbins are connected in series and the unconnected inductive coil leads (not shown) are disposed in a housing 20 of the sensor assembly and in turn, connected to respective pins 22 and 24 which pass through a housing wall and become part of a connector 26 which is coupled externally to the wall housing 20. The pins 22 and 24 of connector 26 provide an electrical coupling through the housing wall to the internal series connected inductive coils. Accordingly, an AC voltage at a desired frequency may be applied across the pins 22 and 24 to drive the inductive proximity sensor as will become better understood from the description found herein below.

Figure 2:
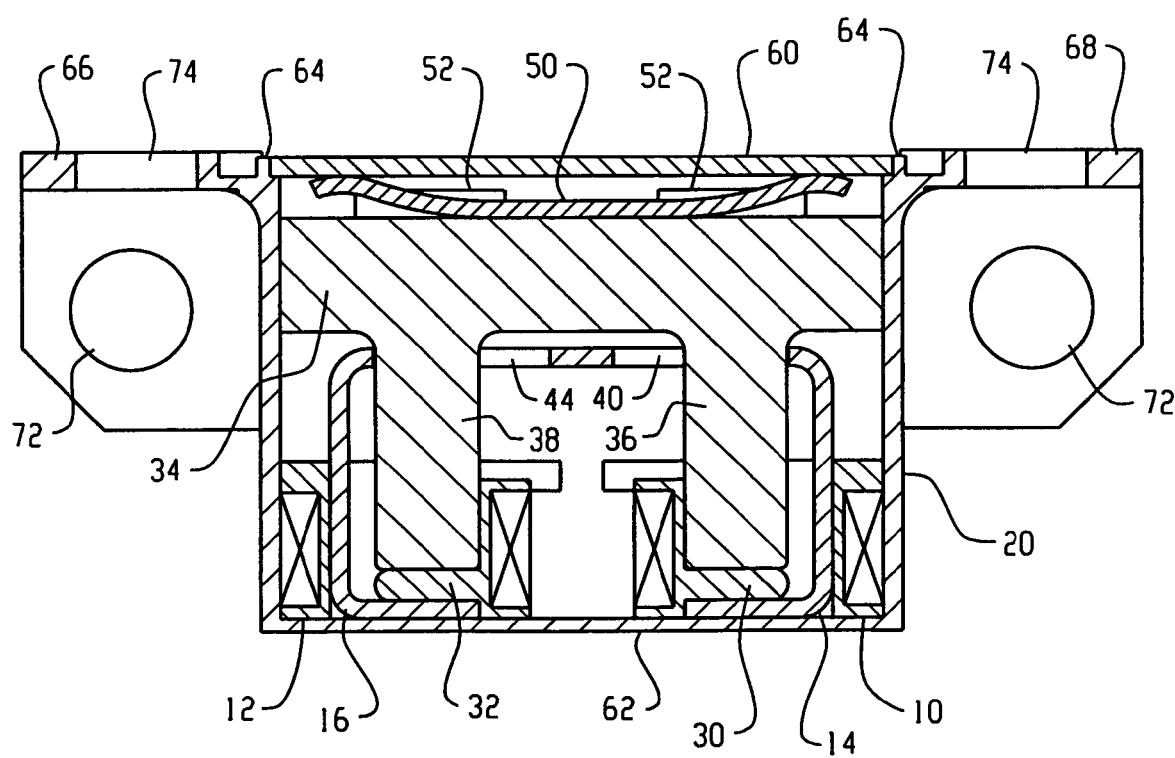
FIG. 2 is a cross-sectional view of the exemplary proximity sensor assembly of FIG. 1 disposed in a sensor housing.
Figure 3:
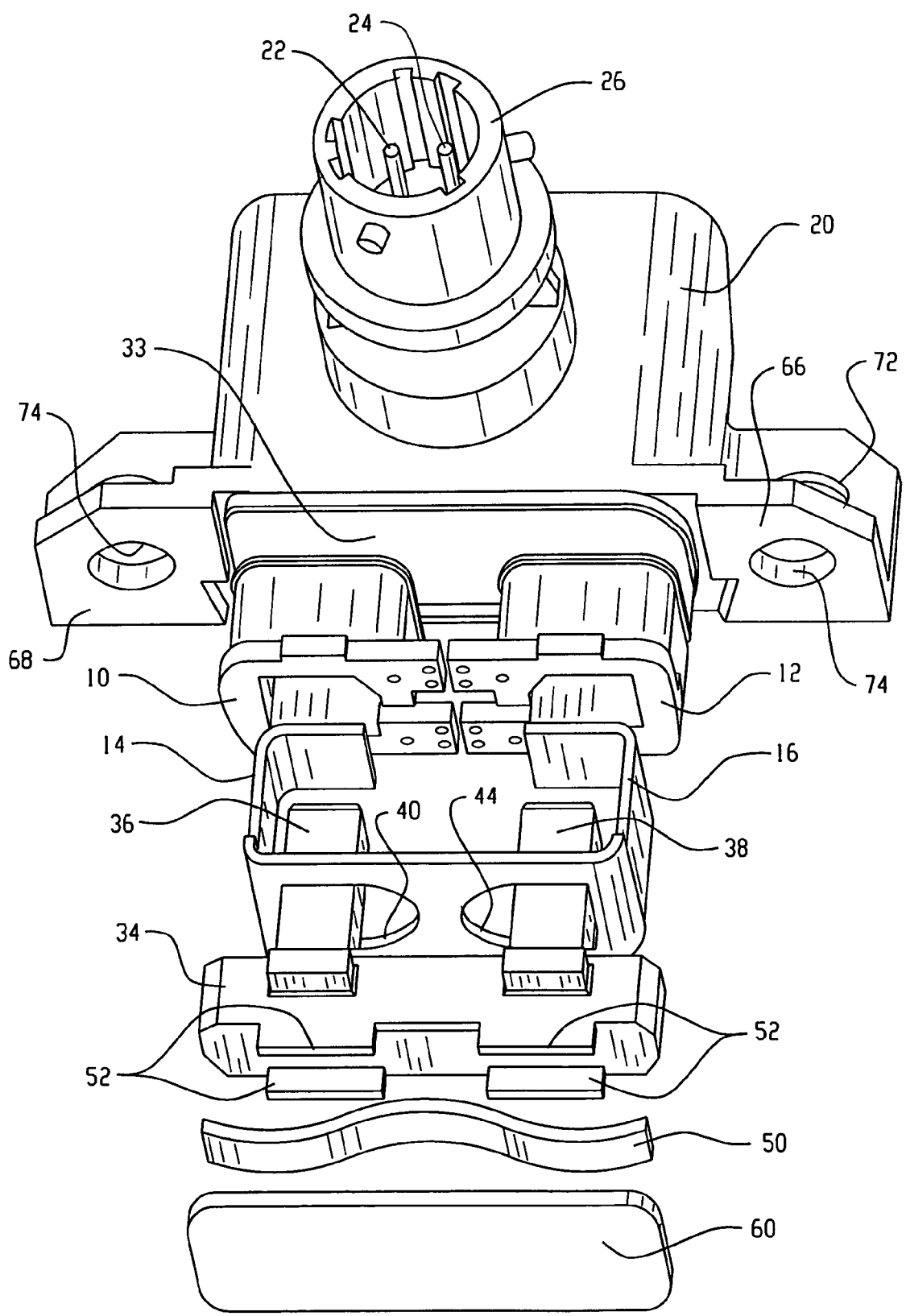
FIG. 3 is an exploded, breakaway isometric view of the components of the exemplary proximity sensor embodiment of FIG. 2.

Each bobbin 10 and 12 includes an integral ledge 30 and 32, respectively, which creates a pocket in the bottom of each bobbin into which the foot of the respective leg 14 and 16 may be contained. Each ledge 30 and 32 is configured in the respective bobbin to rest on top of the foot of the respective core leg 14 and 16 as shown in FIGS. 1A and 2. Once the core 18 and coil wound bobbins 10 and 12 are assembled and disposed in the housing 20 through an opening 33, a thruster component 34 is added to the assembly. In the present embodiment, the thruster 34 is "pi" shaped comprising legs 36 and 38 which are disposed respectively through openings 40 and 44 on top of the C shaped core 18 and into the bobbins 10 and 12, respectively. The bottoms of the legs 36 and 38 rest respectively on top of the ledges 30 and 32 within the bobbins 10 and 12.

A spring element 50, which may be a wavy leaf spring, for example, is disposed on top of the "pi" shaped thruster 34 and positioned in place by integral guides 52 which protrude from each side of the top of the thruster 34. The spring element 50 may extend over almost the entire length of the top surface of the thruster 34. After the proximity sensor is assembled in the housing 20, a cover plate 60 is affixed over the housing opening 33, thereby compressing the leaf spring 50 atop the thruster 34 which in turn, applies a downward force on the thruster legs 36 and 38. Each thruster leg 36 and 38, in turn, forces the respective integral bobbin ledge 30 and 32 into the respective foot of the C shaped inductive core 34. This compression ultimately presses each foot of the core 34 onto the internal surface of the sensing wall or face 62 of the sensor housing 20. It is understood that the cover plate 60 is used in the present embodiment only by way of example and that a compressive element other than the cover plate may be used just as well.

The spring element 50 may be designed to withstand the number of g forces called for by a design specification. In the present embodiment, the force, exerted by the leaf spring 50, represents 500 to 1,000 g's (gravitational constants) of preload. In addition, the cover plate 60 may be forced down upon the leaf spring 50 and into an indented rim 64 around the housing opening 33 with a press ram, and tack welded into place, for example. Thereafter, the press ram may be removed and the welding of the cover plate 60 to the rim 64 of the housing opening 33 may be completed. In the present example, the cover plate 60 is flush mounted to the housing wall around the opening 33 affording a permanent sealed chamber within the housing 20 containing the compressed assembly of components of the proximity sensor. This compressed assembly provides self-aligned coils and prevents the sensor components from separating under high shock conditions.

As noted above, each bobbin 10 and 12 includes a square pocket in the bottom thereof to contain the foot of the respective leg 14 and 16 of the C shaped core 34. As the foot of each core leg 14 and 16 fits into a square pocket under the respective ledge 30 and 32 in the bottom of each bobbin 10 and 12, each bobbin 10 and 12 is rotationally constrained under compression. The depth of the square pocket in the bottom of each bobbin 10 and 12 together with the thickness of the material of the core 34 determines the relative position of the inductive coil/bobbin 10 and 12 to the inductive core leg 14 and 16, respectively.

The housing 20 may include L-shaped, winged extensions 66 and 68 at each side thereof. Each side of each L-shaped extension 66 and 68 includes an opening 72 and 74 through which a screw or bolt may be inserted for mounting the sensor assembly to a barrier (not shown). Accordingly, the sensor assembly may be mounted and secured to the barrier depending on the movement of the target to the sensing face 62.

Since the dimensions of the sensor components may be controlled to a high degree of precision, then the relative positions of the bobbin and core leg may be likewise controlled to a high level of precision, i.e. self-aligned. The magnetic properties of the core material, the number of turns of the induction coils, the sensor housing material properties, the core geometry, and all of the aforementioned specifications may be likewise controlled to a high degree of precision. These features will allow the proximity sensor to be successfully fabricated and assembled without in-process calibration and without securing adhesives which will also significantly enhance the survivability of the proximity sensor, particularly in high shock environments.

Normally, inductive proximity sensors similar in design to the sensor described herein above can not operate effectively to monitor the relative position of a target of permeable or magnetic material through barriers of conductive material, like aluminum and copper, for example, due primarily to the operating frequencies thereof. In accordance with another aspect of the present invention, applicant has discovered a method of operating a non-intrusive proximity sensor for monitoring the relative position of a target of permeable or magnetic material through barriers of conductive material. This aspect of the present invention will now be described in connection with FIGS. 4–12.

A sketch of a proximity sensor 70 suitable for use in the operating method of the present invention is shown in FIG. 4. The proximity sensor 70 may be similar in design to the sensor assembly described herein above and for this reason, common reference numerals will be used for sensor components previously described. For example, the proximity sensor 70 may have a housing 20, a sensing face 62 and an electrical connector 26 as described above. FIG. 5 is a sketch illustrating an application of a non-intrusive application of the proximity sensor 70. Referring to FIG. 5, the proximity sensor 70 is secured in place with the sensing face 62 thereof in juxtaposition with one side of a conductive barrier 72, which may be a wall or bulkhead of an aircraft, for example. A target 74 is positionable relative to the proximity sensor 70 on the other side of the conductive plate 72 so that the sensor 70 may monitor the relative position of the target 74 through the conductive plate 72, i.e. non-intrusively. In addition, a drive and signal processing unit 76 is electrically coupled across the pins 22 and 24 of the connector 26, which pins are electrically coupled to the inductive coils of the sensor 70 as described herein above.

The electronic drive and signal processing unit 76 being used for proximity sensing in the present embodiment may be digital signal processor (DSP) or microprocessor based. The unit 76 may be programmed to output a drive signal via a digital-to-analog (D/A) converter to the sensor 70 (i.e. across pins 22 and 24) at virtually any frequency. Also, it is understood that in an aircraft system, for example, there may be a large number of different proximity sensors all configured for corresponding different non-intrusive proximity sensing applications, such as through conductive barriers of pressure bulkheads, door casings, aircraft skins, composite panels containing a conductive mesh for EMI protection, etc. The present embodiment would also permit operation of proximity sensors in close proximity to conductive side metals such as sensor or target mounting brackets, for example. Accordingly, the different proximity sensors in the system may be all coupled to a common processing unit 76. Such an architecture would allow the common processing unit 76 to be programmed to excite each different individual sensor 70 at a frequency appropriate for its installation configuration. A mechanical actuation distance 78 (sensor/target gap variation during actuation) and the thickness and composition of the material of the barrier 72 would determine the appropriate drive frequency for that particular installation.

In the present embodiment, the target 74 may be a conventional plate of permeable or magnetic material, like a ferrous material, for example, as shown in the plan and side views of FIGS. 6A and 6B, respectively. The length L, width W and thickness T of the target plate 72 for the present example are 1.50 inches, 0.75 inches and 0.10 inches, respectively.

Figure 7:
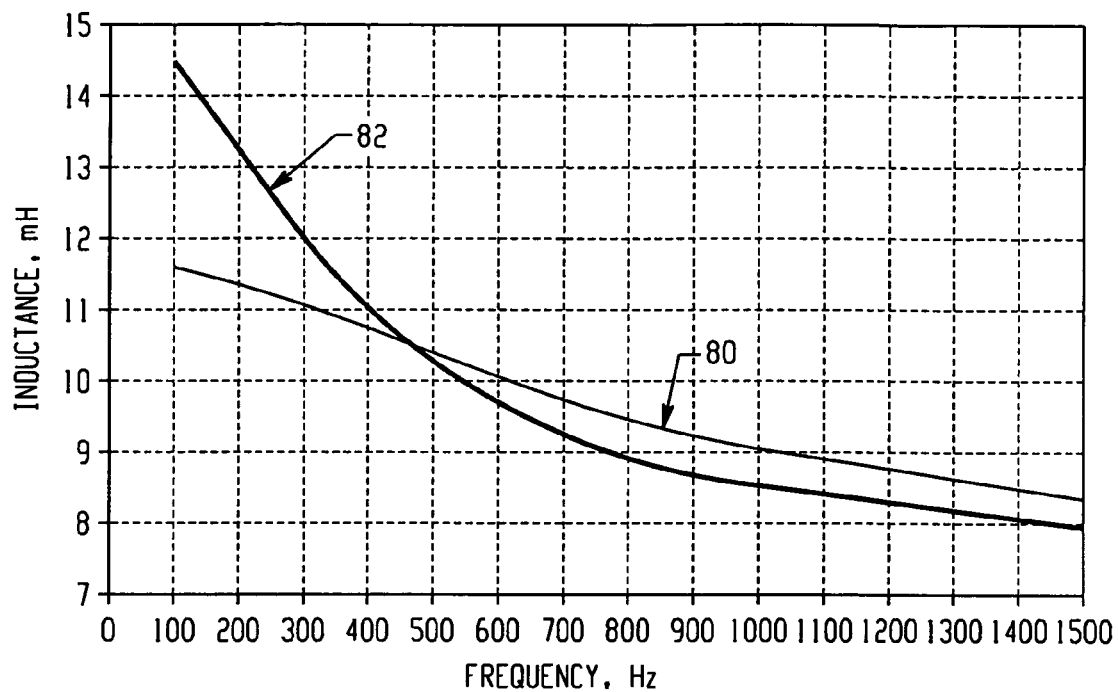
FIGS. 7–9 are graphs of measured sensor inductance vs. drive frequency for different test conditions in accordance with the other aspect of the present invention.

Tests were conducted on the proximity sensing configuration of FIG. 5 which illustrates an orientation of the proximity sensor 70, the conductive barrier 72, and the standard ferrous target 74 which is positionable relative to the sensor 70. The sensor 70 is interfaced with the processing unit 76 which may include a programmable LCR bridge capable of measuring the inductance or inductive output of the sensor 70 at various drive frequencies. FIG. 7 is a graph of measured sensor inductance vs. drive frequency for two test conditions using an 0.062 inch thick aluminum conductive barrier 72. In FIG. 7, line 80 exemplifies the test results of the proximity sensor inductance with the conductive barrier 72 in place and no target 74 present (i.e. indicative of a "far" position); and line 82 exemplifies the test results of the proximity sensor inductance with the conductive barrier 72 in place and the target 74 present (i.e. indicative of a "near" position). Note that at or below drive frequencies of approximately 350 Hz, the measured inductances of the two conditions 80 and 82 are sufficiently distinguishable for proximity sensing operation.

Figure 8:
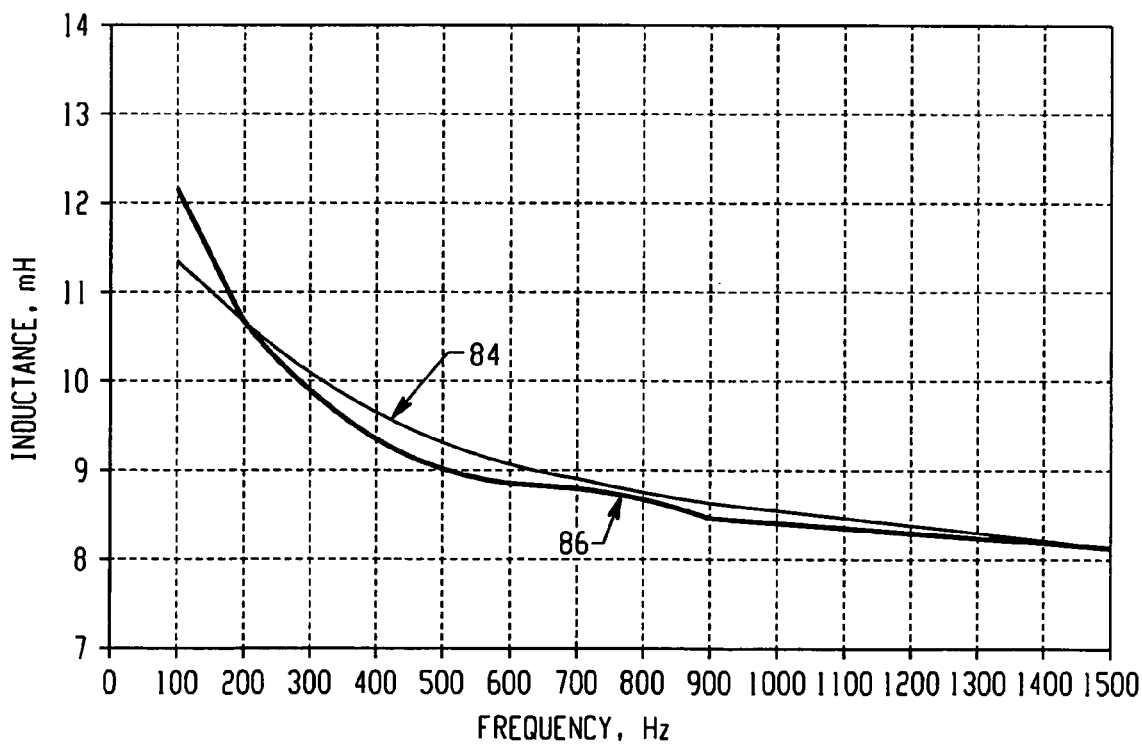

FIG. 8 is a graph of measured sensor inductance vs. drive frequency for another two test conditions using a 0.125 inch thick aluminum conductive barrier 72. In FIG. 8, line 84 exemplifies the test results of the proximity sensor inductance with the conductive barrier 72 in place and no target 74 present (i.e. indicative of a "far" position); and line 86 exemplifies the test results of the proximity sensor inductance with the conductive barrier 72 in place and the target 74 present (i.e. indicative of a "near" position). Note that at or below drive frequencies of approximately 100 Hz, the measured inductances of the two conditions 84 and 86 are sufficiently distinguishable for proximity sensing operation.

Figure 9:
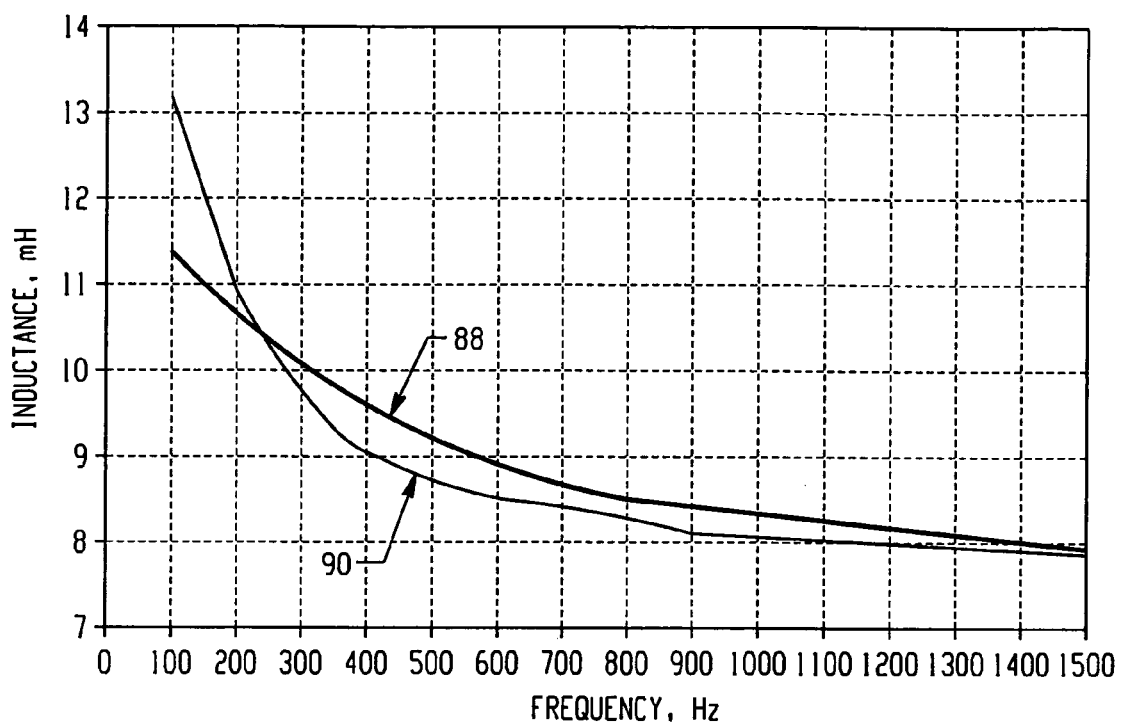

FIG. 9 is a graph of measured sensor inductance vs. drive frequency for yet another two test conditions using an 0.062 inch thick copper conductive barrier 72. In FIG. 9, line 88 exemplifies the test results of the proximity sensor inductance with the conductive barrier 72 in place and no target 74 present (i.e. indicative of a "far" position); and line 90 exemplifies the test results of the proximity sensor inductance with the conductive barrier 72 in place and the target 74 present (i.e. indicative of a "near" position). Note that at or below drive frequencies of approximately 150 Hz, the measured inductances of the two conditions 84 and 86 are sufficiently distinguishable for proximity sensing operation.

Figure 10:
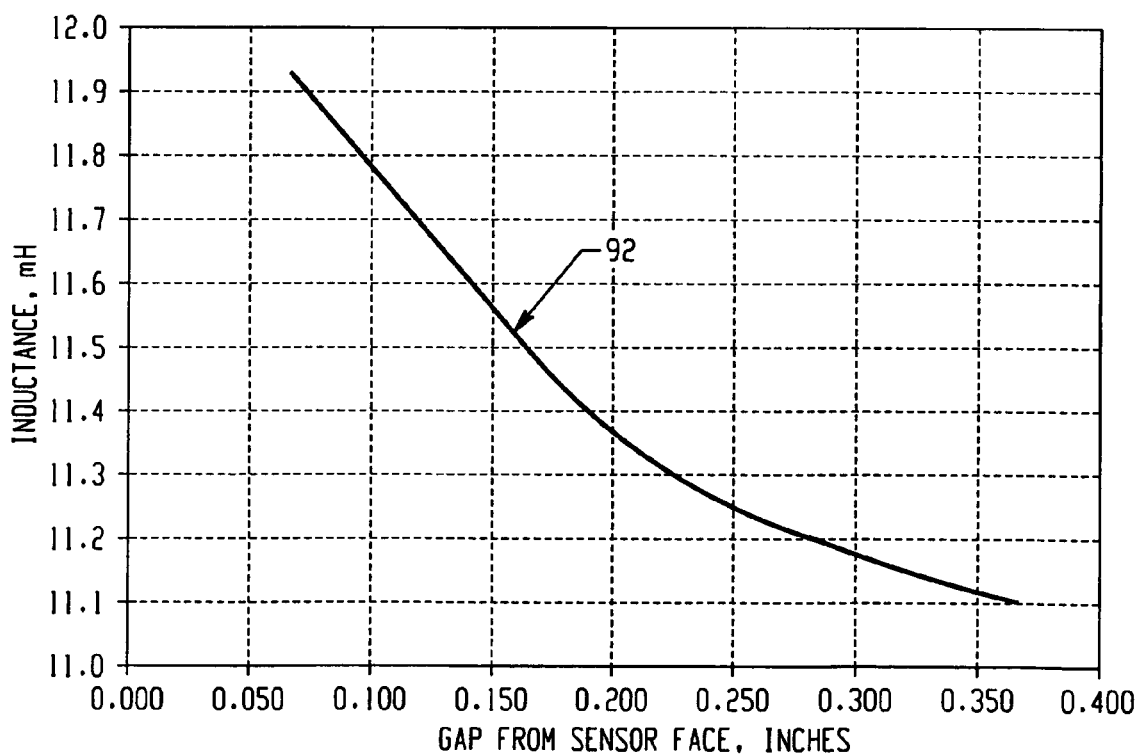
FIGS. 10–12 are graphs of measured sensor inductance vs. target gap for additional test conditions in accordance with the other aspect of the present invention.
Figure 11:
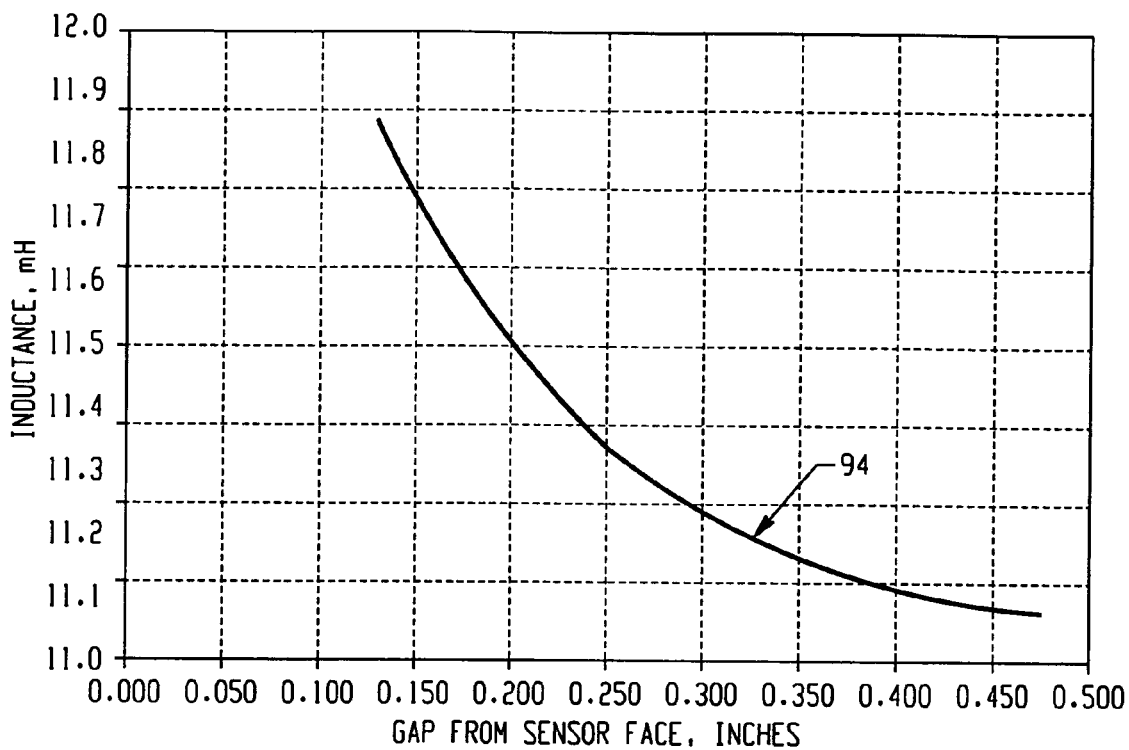
Figure 12:
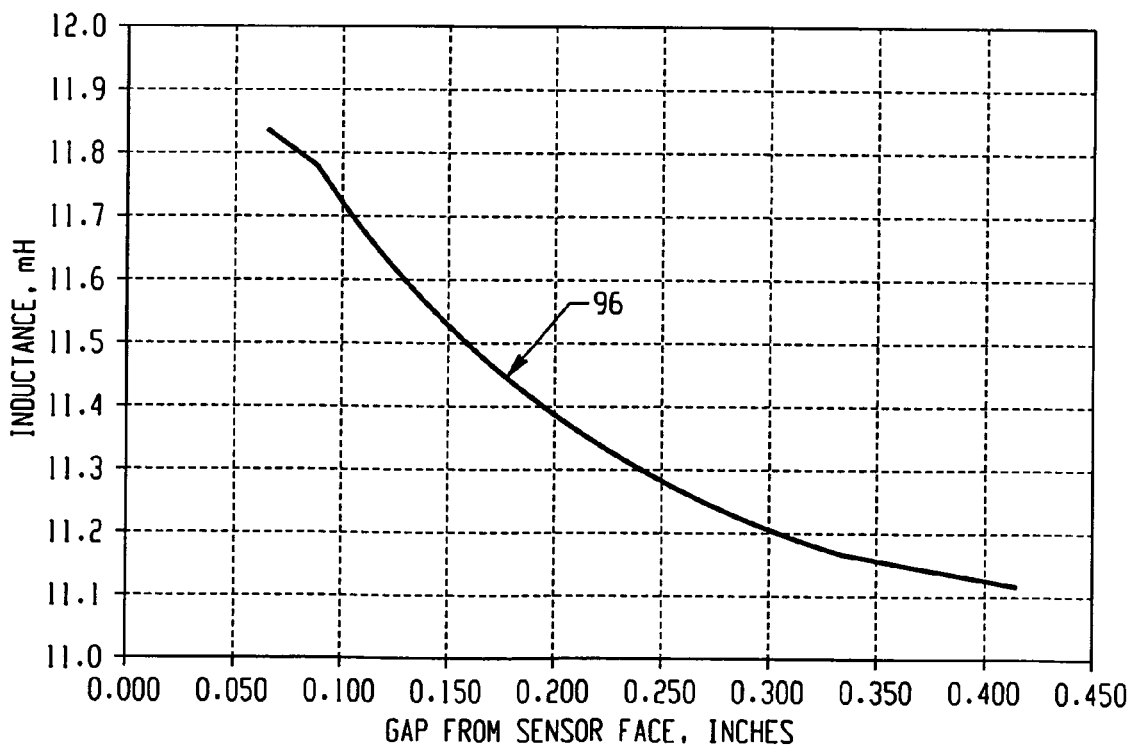

For the foregoing described tests, sensor inductance was measured with the standard target 74 located immediately adjacent to the conductive barrier 72 which is representative of the target in the "near" position in a typical mechanical actuation. The graphs of FIGS. 10–12 represent three additional test conditions performed whereby the target 74 is incrementally moved away from the conductive barrier 72 which is representative of a typical mechanical actuation where the target moves from the "near" position to the "far" position. The graphs of FIGS. 10–12 indicate the total available inductance bandwidth in a typical application at the selected drive frequency.

Line 92 of FIG. 10 exemplifies test results of sensor inductance vs. gap 78 at a drive frequency of 300 Hz using a 0.062 inch thick aluminum conductive barrier 72. Note that the test results indicate an available inductance bandwidth of approximately 800 microHenries for a change in gap 78 from 0.062 to 0.35 inches. Line 94 of FIG. 11 exemplifies test results of sensor inductance vs. gap 78 at a drive frequency of 100 Hz using a 0.125 inch thick aluminum conductive barrier 72. Note that the test results indicate an available inductance bandwidth of approximately 630 microHenries for a change in gap 78 from 0.125 to 0.475 inches. Line 96 of FIG. 12 exemplifies test results of sensor inductance vs. gap 78 at a drive frequency of 150 Hz using a 0.063 inch thick copper conductive barrier 72. Note that the test results indicate an available inductance bandwidth of approximately 700 microHenries for a change in gap 78 from 0.062 to 0.400 inches.

The above described test results demonstrate that, for drive frequencies less than 350 Hz (depending on the barrier material and its thickness), eddy current effects caused by non-intrusive proximity sensing through a conductive barrier may be reduced to a level where reliable proximity sensing can be achieved. From the particular set of tests it is observed that a minimum operating bandwidth for the proximity sensing is approximately 400 microHenries of inductance. This minimum allows for reasonable system tolerances and built in test (BITE) information. The operating inductance bandwidth may be determined by driving the proximity sensor at a selected frequency based on the material and thickness of the conductive barrier and measuring the sensor inductance with the conductive barrier in place and under the two conditions of: (1) no target on the opposing side of the barrier (i.e. "far" position); and (2) a standard sized permeable or magnetic target placed in close proximity to or against the opposing side of the conductive barrier (i.e. the side opposite the side on which the sensor is mounted) which is indicative of a "near" position. The measured inductance value without the target present (far position) is subtracted from the measured inductance value with the standard target present (near position). Note that the operating inductance bandwidth of the sensor is associated with the selected drive frequency.

While the present invention has been described herein above in connection with one or more embodiments, it is understood that the description is merely by way of example with no intent on limiting the present invention in any way to any single embodiment. Rather, the present invention should be construed in breadth and broad scope in accordance with the recitation of the claims appended hereto.

What is claimed is:

1. A method of non-intrusive, inductive proximity sensing of a target through a conductive barrier, said method comprising the steps of:
    disposing an inductive proximity sensor on one side of a barrier of conductive material;
    disposing the target on the other side of said barrier;
    applying an operating drive frequency to said inductive proximity sensor;
    varying the drive frequency over a frequency range;
    measuring an inductive output of said proximity sensor at different drive frequencies and different target positions in relation to said proximity sensor to obtain inductive output measurements;
    determining a particular drive frequency for operating said proximity sensor from said inductive output measurements; and
    operating said proximity sensor with said particular drive frequency to non-intrusively sense the proximity of said target through the conductive barrier.

2. The method of claim 1 including the steps of:
    varying the gap between the target and proximity sensor over a gap range;
    measuring the inductive output of the proximity sensor at the particular drive frequency and different gaps to obtain inductive output measurements at the different gaps;
    determining the operating induction bandwidth of the proximity sensor operated at approximately the particular drive frequency from said inductive output measurements at the different gaps; and
    using the determined induction bandwidth for proximity sensing of the target through the conductive barrier.

3. The method of claim 1 wherein the step of measuring includes measuring an inductive output of said proximity sensor at different drive frequencies and at near and far representative target positions in relation to said proximity sensor to obtain inductive output measurements.

4. The method of claim 1 wherein the step of disposing the proximity sensor includes the step of disposing the inductive proximity sensor on one side of an aluminum barrier of a predetermined thickness.

5. The method of claim 4 wherein the step of disposing the proximity sensor includes the step of disposing the inductive proximity sensor on one side of an aluminum barrier of a thickness in the approximate range of 0.062 to 0.125 inches.

6. The method of claim 1 wherein the step of disposing the proximity sensor includes the step of disposing the inductive proximity sensor on one side of a copper barrier of a predetermined thickness.

7. The method of claim 6 wherein the step of disposing the proximity sensor includes the step of disposing the inductive proximity sensor on one side of a copper barrier of a thickness of approximately 0.062 inches.

8. The method of claim 1 wherein the step of disposing the target includes the step of disposing a target of permeable material on the other side of the barrier.

9. The method of claim 1 wherein the step of disposing a target includes the step of disposing a target of magnetic material on the other side of the barrier.

10. The method of claim 1 wherein the step of operating includes operating the proximity sensor with a drive frequency of no greater than approximately 350 Hz to non-intrusively sense the proximity of the target through the conductive barrier.

11. A method of non-intrusive, inductive proximity sensing of a target through a conductive barrier, said method comprising the steps of:
    disposing an inductive proximity sensor on one side of a barrier of conductive material;
    disposing the target on the other side of said barrier;
    determining a particular drive frequency for operating said proximity sensor based on the conductive material and thickness of the barrier; and
    operating said proximity sensor with said particular drive frequency to non-intrusively sense the proximity of said target through the conductive barrier.

12. The method of claim 11 including the steps of:
    varying the gap between the target and proximity sensor over a gap range;
    measuring the inductive output of the proximity sensor at the particular drive frequency and different gaps to obtain inductive output measurements at the different gaps;
    determining the operating induction bandwidth of the proximity sensor operated at approximately the particular drive frequency from said inductive output measurements at the different gaps; and
    using the determined induction bandwidth for proximity sensing of the target through the conductive barrier.

13. The method of claim 11 wherein the step of determining includes determining the particular drive frequency for operating the proximity sensor based on a near target gap and a far target gap.

14. The method of claim 11 wherein the step of determining includes:
   determining a sensor/target gap variation during actuation for a particular application; and
   determining the particular drive frequency for operating the proximity sensor based on said sensor/target gap variation.

15. The method of claim 11 wherein the step of disposing the target includes disposing a permeable material on the other side of said barrier.

16. The method of claim 11 wherein the step of disposing the target includes disposing a magnetic material on the other side of said barrier.

17. A method of determining an operating induction bandwidth of a non-intrusive, inductive proximity sensor for sensing of a target through a conductive barrier, said method comprising the steps of:
   disposing an inductive proximity sensor on one side of a barrier of conductive material;
   disposing the target on the other side of said barrier;
   determining a particular drive frequency for operating said proximity sensor;
   varying the gap between the target and proximity sensor over a gap range;
   measuring an inductive output of the proximity sensor at the particular drive frequency and different gaps to obtain inductive output measurements at the different gaps; and
   determining the operating induction bandwidth of the proximity sensor operated at approximately the particular drive frequency from said inductive output measurements at the different gaps.

18. The method of claim 17 wherein the step of determining the drive frequency includes determining the particular drive frequency for operating the proximity sensor based on the conductive material and thickness of the barrier.

19. The method of claim 17 wherein the step of determining the drive frequency includes:
   determining a sensor/target gap variation during actuation for a particular application; and
   determining the particular drive frequency for operating the proximity sensor based on said sensor/target gap variation.

20. The method of claim 17 wherein the step of varying the gap includes:
   determining a sensor/target gap variation during actuation for a particular application; and
   varying the gap between the target and proximity sensor over a gap range based on the determined sensor/target gap variation during actuation.

* * * * *